US012759887B2

(12) United States Patent
Pearlstein et al.

(10) Patent No.: US 12,759,887 B2
(45) Date of Patent: Oct. 13, 2026

(54) ORGANOSILICON PRECURSORS FOR DEPOSITION OF SILICON-CONTAINING FILMS

(71) Applicant: VERSUM MATERIALS US, LLC, Tempe, AZ (US)

(72) Inventors: Ronald M. Pearlstein, San Marcos, CA (US); Manchao Xiao, San Diego, CA (US); Richard Ho, Tempe, AZ (US); Xinjian Lei, Vista, CA (US)

(73) Assignee: Versum Materials US, LLC, Tempe, AZ (US)

( * ) Notice: Subject to any disclaimer, the term of this patent is extended or adjusted under 35 U.S.C. 154(b) by 1168 days.

(21) Appl. No.: 17/613,624

(22) PCT Filed: May 21, 2020

(86) PCT No.: PCT/US2020/033908
§ 371 (c)(1),
(2) Date: Nov. 23, 2021

(87) PCT Pub. No.: WO2020/242868
PCT Pub. Date: Dec. 3, 2020

(65) Prior Publication Data

US 2022/0234903 A1 Jul. 28, 2022

Related U.S. Application Data

(60) Provisional application No. 62/852,545, filed on May 24, 2019.

(51) Int. Cl.

| | |
|---|---|
| ***C07F 7/08*** | (2006.01) |
| ***C01B 33/12*** | (2006.01) |
| ***C07F 7/10*** | (2006.01) |
| ***C09D 1/00*** | (2006.01) |
| ***C23C 16/40*** | (2006.01) |
| ***C23C 16/44*** | (2006.01) |
| ***C23C 16/455*** | (2006.01) |

(52) U.S. Cl.
CPC .......... *C01B 33/126* (2013.01); *C07F 7/0896* (2013.01); *C07F 7/10* (2013.01); *C09D 1/00* (2013.01); *C23C 16/401* (2013.01); *C23C 16/4408* (2013.01); *C23C 16/45553* (2013.01); *C01P 2006/10* (2013.01); *C01P 2006/40* (2013.01); *C01P 2006/80* (2013.01)

(58) Field of Classification Search
CPC .... C07F 7/0896; C07F 7/10; C23C 16/45553; C09D 1/00
See application file for complete search history.

(56) References Cited

U.S. PATENT DOCUMENTS

| | | | |
|---|---|---|---|
| 5,069,244 | A | 12/1991 | Miyazaki et al. |
| 5,332,849 | A | 7/1994 | Jung et al. |
| 5,465,766 | A | 11/1995 | Siegele et al. |
| 6,077,356 | A | 6/2000 | Bouchard |
| 6,127,072 | A | 10/2000 | Shiba et al. |
| 7,084,076 | B2 | 8/2006 | Park et al. |
| 7,334,595 | B2 | 2/2008 | Birtcher et al. |
| 7,935,617 | B2 | 5/2011 | Tweet |
| 8,912,353 | B2 | 12/2014 | Xiao et al. |
| 8,940,648 | B2 | 1/2015 | Xiao et al. |
| 9,005,719 | B2 | 4/2015 | Xiao et al. |
| 9,245,740 | B2 | 1/2016 | Jang et al. |
| 9,337,018 | B2 | 5/2016 | Xiao et al. |
| 9,643,844 | B2 | 5/2017 | Thompson |
| 2007/0032676 | A1 | 2/2007 | Todd |
| 2014/0183706 | A1 | 7/2014 | Yang et al. |
| 2015/0087139 | A1 | 3/2015 | O'Neill et al. |
| 2015/0275355 | A1 | 10/2015 | Mallikarjunan et al. |
| 2015/0364321 | A1* | 12/2015 | Vrtis ................. H01L 21/02274 438/759 |
| 2015/0376211 | A1 | 12/2015 | Girard et al. |
| 2016/0002039 | A1 | 1/2016 | Thompson |
| 2019/0055645 | A1 | 2/2019 | Li et al. |

FOREIGN PATENT DOCUMENTS

| | | | | |
|---|---|---|---|---|
| EP | 2692897 B1 | 12/2018 | | |
| TW | 202018118 A | 5/2020 | | |
| WO | WO-2014134476 A1 * | 9/2014 | ........... | C01B 1/0828 |
| WO | 2015/105337 A1 | 7/2015 | | |
| WO | 2015/105350 A1 | 7/2015 | | |
| WO | 2017/095431 A1 | 6/2017 | | |

OTHER PUBLICATIONS

R. Hager, et al. 122 Chemische Berichte 2115-2119 (1989) ("Hager") (Year: 1989).*

D. Chandrasekhar, et al. 441 MRS Online Proceedings Library (OPL) 723-728 (1996) (Year: 1996).*

Chandrasekhar, D., et al. "New Silicon-Carbon Materials Incorporating Si4C Building Blocks," Mat. Res. Soc. Symp. Proc., 1997 vol. 441, pp. 723-728.

Chandrasekhar, D., et al. "New Silicon-Carbon Materials Incorporating SI4C Building Blocks," Materials Research Society Symposium Proceedings, vol. 441 (c)1997, pp. 723-728.

Anderson, et al., "Synthesis of Aryl-substituted p-Disilylbenzenes", Journal of the Chemical Society, 1965, p. 2269 (1-39).

Chandrasekhar, et al., "Strategies for the synthesis of highly concentrated Si1-yCy diamond-structured systems", Applied Physics Letters, vol. 72, Issue 17, Apr. 27, 1998, pp. 2117-2119.

F. Mareš, et al., "Organosilicon compounds. LXXVI. Synthesis of some silyl substituted phenyldimethylsilanes", Collection of Czechoslovak Chemical Communications, vol. 36, No. 6, Jun. 15, 1970, pp. 2166-2173.

(Continued)

*Primary Examiner* — Alexander R Pagano
*Assistant Examiner* — Frank S. Hou
(74) *Attorney, Agent, or Firm* — Versum Materials US, LLC; David K. Benson

(57) ABSTRACT

A composition comprises at least one a composition comprising at least one organosilicon compound which has two or more silicon atoms connected to either a carbon atom or a hydrocarbon moiety.

6 Claims, No Drawings

(56) References Cited

OTHER PUBLICATIONS

Han, et al., "Direct Synthesis of Tris(chlorosilyl)methanes Containing Si-H Bonds", Organometallics, vol. 16 No. 1, Jan. 7, 1997, pp. 93-96.

Ishikawa, et al., "Synthesis of Chlorosilanes from (Fluoroalkyl)silanes, Bis(silyl)benzenes, and .alpha.,.omega.—Dihydropolysiloxanes", Organometallics, vol. 13, No. 3, Mar. 1, 1994, pp. 808-812.

Kazi, et al., "Plasma damage mechanisms in low k organosilicate glass and their inhibition by Ar ion bombardment", Journal of Vacuum Science & Technology A, vol. 32, No. 2, Dec 9, 2013, p. 021302.

Liu, et al., "Synthesis and characterization of poly(silphenylenesiloxane)s containing functional side groups, a study to high-temperature elastomer", Science and Technology of Advanced Materials, vol. 4, No. 1, 2003, pp. 27-34.

Matsuda, et al., "Moisture-Insensitive Polycarbosilane Films with Superior Mechanical Properties", ACS Applied Materials & Interfaces, vol. 4, No. 5, Apr. 13, 2012, pp. 2659-2663.

Nametkin, et al., "Interaction Of DISYLIL-Substituted Carbon Carbons Containing Si - H Bonds with Chlorine Tin", Reports of the Academy of Sciences of the USSR, vol. 197, No. 2, 1971, pp. 351-354.

"International Search Report and Written Opinion received for PCT Application No. PCT/US2020/033908, mailing date Sep. 3, 2020", 10 Pages.

"International Preliminary Report on Patentability received for PCT Application No. PCT/US2020/033908, mailing date Dec 2, 2021", 09 Pages.

Rimsza, et al., "Mechanisms of oxygen plasma damage of amine and methyl terminated organosilicate low-k dielectrics from ab initio molecular dynamics simulations", Journal of Physics D: Applied Physics, vol. 47, No. 33, Jul. 24, 2014, p. 335204.

Shea, et al., "Aryl-bridged polysilsesquioxanes -- new microporous materials", Chemistry of Materials, vol. 1, No. 6, Nov. 1, 1989, pp. 572-574.

Wang, et al., "Oligosilylarylnitrile: The Thermoresistant Thermosetting Resin with High Comprehensive Properties", ACS applied materials & interfaces, vol. 10, No. 14, Mar. 22, 2018, pp. 11933-11940.

Yoon, et al., "Novel Organosilicate Polymer Resists for High Resolution E-Beam Lithography", Proceedings Published 2012 by the American Chemical Society, 2012, p. 1.

* cited by examiner

ORGANOSILICON PRECURSORS FOR DEPOSITION OF SILICON-CONTAINING FILMS

CROSS-REFERENCE TO RELATED APPLICATIONS

This application is a National Stage filing under 35 U.S.C. 371 of International Patent Application No. PCT/US20/33908, filed May 21, 2020, which claims priority to U.S. provisional application 62/852,545 filed on May 24, 2019. The entire contents of these application are incorporated herein by reference in their entirety.

BACKGROUND OF THE INVENTION

The invention relates to organosilicon compounds which can be used to deposit silicon and oxygen containing films (e.g. silicon oxide, silicon oxycarbonitride, silicon oxycarbide, carbon-doped silicon oxide, among other silicon and oxygen containing films), methods for using the compounds for depositing silicon oxide containing films as well as films obtained from the compounds and methods.

All references, including publications, patent applications, and patents, cited herein are hereby incorporated by reference to the same extent as if each reference were individually and specifically indicated to be incorporated by reference and were set forth in its entirety herein.

Described herein are novel organosilicon compounds and compositions and methods comprising same to deposit a silicon-containing film such as, without limitation, carbon-doped silicon oxide via a thermal atomic layer deposition (ALD) or plasma enhanced atomic layer deposition (PEALD) process, or a combination thereof. More specifically, described herein is a composition and method for formation of a stoichiometric or a non-stoichiometric silicon-containing film or material at one or more deposition temperatures of about 600° C. or less including, for example, from about 25° C. to about 300° C.

Atomic Layer Deposition (ALD) and Plasma Enhanced Atomic Layer Deposition (PEALD) are processes used to deposit, for example, silicon oxide conformal films at low temperature (<500° C.). In both ALD and PEALD processes, the precursor and reactive gas (such as oxygen or ozone) are separately pulsed in certain number of cycles to form a monolayer of silicon oxide at each cycle. However, silicon oxide deposited at low temperatures using these processes may contain levels of impurities such as, without limitation, carbon (C) or hydrogen (H), which may be detrimental in certain semiconductor applications. To remedy this, one possible solution is to increase the deposition temperature to 500° C. or greater. However, at these higher temperatures, conventional precursors employed by semiconductor industries tend to self-react, thermally decompose, and deposit in a chemical vapor deposition (CVD) mode rather than an ALD mode. The CVD mode deposition has reduced conformality compared to ALD deposition, especially for high aspect ratio structures which are needed in many semiconductor applications. In addition, the CVD mode deposition has less control of film or material thickness than the ALD mode deposition.

Organoaminosilane and chlorosilane precursors are known in the art that can be used to deposit silicon-containing films via Atomic Layer Deposition (ALD) and Plasma Enhanced Atomic Layer Deposition (PEALD) processes at a relatively low-temperature (<300° C.) and with relatively high Growth Per Cycle (GPC>1.5 Å/cycle).

Examples of known precursors and methods are disclosed in the following publications, patents, and patent applications.

U.S. Pat. No. 7,084,076 B2 describes the use of a halogen- or NCO-substituted disiloxane precursor to deposit a silicon oxide film using in a base-catalyzed ALD process.

US Pub. No. 2015087139 AA describes the use of amino-functionalized carbosilanes to deposit silicon containing films via thermal ALD or PEALD processes.

U.S. Pat. No. 9,337,018 B2 describes the use of organoaminodisilanes to deposit silicon containing films via thermal ALD or PEALD processes.

U.S. Pat. Nos. 8,940,648 B2, 9,005,719 B2, and 8,912,353 B2 describe the use of organoaminosilanes to deposit silicon containing films via thermal ALD or PEALD processes.

US Pub. No. 2015275355 AA describes the use of mono- and bis(organoamino)alkylsilanes to deposit silicon containing films via thermal ALD or PEALD processes.

US Pub. No. 2015376211A describes the use of mono (organoamino)-, halido-, and pseudohalido-substituted trisilylamines to deposit silicon containing films via thermal ALD or PEALD processes.

Pub No. WO15105337 and U.S. Pat. No. 9,245,740 B2 describe the use of alkylated trisilylamines to deposit silicon containing films via thermal ALD or PEALD processes.

Pub. No. WO15105350 describes the use of 4-membered ring cyclodisilazanes having at least one Si—H bond to deposit silicon containing films via thermal ALD or PEALD processes.

U.S. Pat. No. 7,084,076 B2 describes the use of a halogen- or NCO-substituted disiloxane precursor to deposit a silicon oxide film using in a base-catalyzed ALD process.

Many of the silicon precursors disclosed in the prior that incorporate methyl groups in the deposited organosilicon glass suffer from a particular deficiency. The methyl groups can be readily lost when the film is exposed to oxidizing conditions in subsequent processing steps, notably oxygen plasma ashing or ozone exposure. Even reducing conditions such as spike anneal under inert gas to temperatures>700° C. and exposure to NH3 plasma is known to remove methyl carbon and thereby eliminate its beneficial role(s) in the films such as reducing dielectric constant and increasing wet etching resistance.

Accordingly, there is a need for ALD precursors that can deposit a dielectric film having a dielectric constant below about 4.0 and below that of pure SiO2 that produce silicon oxide-containing films that exhibit greater resistance to the harsh conditions of oxygen ashing, ozone exposure, and reductive plasma conditions. There is also a need in the art for precursors and methods for depositing high quality silicon-oxide containing films at high growth per cycle (GPC) in order to maximize throughput in a semiconductor manufacturing facility.

SUMMARY

The present development satisfies the needs currently unmet by conventional precursors.

In one aspect, disclosed herein is a composition comprising at least one organosilicon compound having two or more silicon atoms connected to either a carbon atom or a hydrocarbon moiety, wherein the at least one organosilicon compound is selected from the group consisting of i. at least one compound having a methine (HCSi3) moiety, ii. at least one compound having a quaternary carbon (Si4C) moiety, iii. at least one compound having a moiety comprising two silicon atoms linked by a phenylene group, and iv. at least one compound having a moiety comprising two silicon atoms linked by an aliphatic polycyclic moiety.

In another aspect, disclosed herein is a method for depositing a film comprising silicon and oxygen onto a substrate, the method comprising the steps of: a) providing a substrate in a reactor; b) introducing into the reactor a composition comprising at least one organosilicon compound having two or more silicon atoms connected to a carbon atom, wherein the at least one organosilicon compound is selected from the group consisting of i. at least one compound having a methine (HCSi3) moiety, ii. at least one compound having a quaternary carbon (Si4C) moiety, iii. at least one compound having a moiety comprising two silicon atoms linked by a phenylene group, and iv. at least one compound having a moiety comprising two silicon atoms linked by an aliphatic polycyclic moiety; c) purging the reactor with a purge gas; d) introducing at least one of an oxygen-containing source and a nitrogen-containing source into the reactor; and e) purging the reactor with the purge gas, wherein the steps b through e are repeated until a desired thickness of film is deposited; and wherein the method is conducted at one or more temperatures ranging from about 25° C. to 600° C.

The process disclosed herein is a process for the deposition of a stoichiometric or nonstoichiometric silicon and oxygen containing material or film, such as without limitation, a silicon oxide, a carbon doped silicon oxide, a silicon oxynitride film, or a carbon doped silicon oxynitride film at relatively low temperatures, e.g., at one or more temperatures of 600° C. or lower, in a plasma enhanced ALD (PEALD), plasma enhanced cyclic chemical vapor deposition (PECCVD), a flowable chemical vapor deposition (FCVD), a plasma enhanced flowable chemical vapor deposition (PEFCVD), a plasma enhanced ALD-like process, or an ALD process with oxygen-containing reactant source, a nitrogen-containing reactant source, or a combination thereof.

Methods of making the above compounds are also disclosed herein.

The embodiments of the invention can be used alone or in combinations with each other.

DETAILED DESCRIPTION

The use of the terms “a” and “an” and “the” and similar referents in the context of describing the invention (especially in the context of the following claims) are to be construed to cover both the singular and the plural, unless otherwise indicated herein or clearly contradicted by context. The terms “comprising,” “having,” “including,” and “containing” are to be construed as open-ended terms (i.e., meaning “including, but not limited to,”) unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., “such as”) provided herein, is intended merely to better illuminate the invention and does not pose a limitation on the scope of the invention unless otherwise claimed. No language in the specification should be construed as indicating any non-claimed element as essential to the practice of the invention.

Described herein are compositions and methods related to the formation of a stoichiometric or nonstoichiometric film or material comprising silicon and oxygen such as, without limitation, a silicon oxide, a carbon-doped silicon oxide film, a silicon oxynitride, or a carbon-doped silicon oxynitride film or combinations thereof with one or more temperatures, of about 600° C. or less, or from about 25° C. to about 600° C. and, in some embodiments, from 25° C. to about 300° C. The films described herein are deposited in a deposition process such as an atomic layer deposition (ALD) or in an ALD-like process such as, without limitation, a plasma enhanced ALD (PEALD) or a plasma enhanced cyclic chemical vapor deposition process (PECCVD). The low temperature deposition (e.g., one or more deposition temperatures ranging from about ambient temperature to 600° C.) methods described herein provide films or materials that exhibit at least one or more of the following advantages: a density of about 2.1 g/cc or greater, low chemical impurity, high conformality in a thermal atomic layer deposition, a plasma enhanced atomic layer deposition (ALD) process or a plasma enhanced ALD-like process, an ability to adjust carbon content in the resulting film; and/or films have an etching rate of 5 Angstroms per second (Å/sec) or less when measured in 0.5 wt % dilute HF. For carbon-doped silicon oxide films, greater than 1% carbon is desired to tune the etch rate to values below 2 Å/sec in 0.5 wt % dilute HF in addition to other characteristics such as, without limitation, a density of about 1.8 g/cc or greater or about 2.0 g/cc or greater.

Methods disclosed herein can be practiced using equipment known in the art. For example, methods can employ a reactor that is conventional in the semiconductor manufacturing art.

Disclosed herein is a precursor composition comprising at least one organosilicon compound having two, three or four silicon atoms connected to either a carbon atom or a hydrocarbon moiety, wherein the at least one organosilicon compound is selected from the group consisting of i. at least one compound having a methine (HCSi3) moiety, ii. at least one compound having a quaternary carbon (Si4C) moiety, iii. at least one compound having a moiety comprising two silicon atoms linked by a phenylene group, and iv. at least one compound having a moiety comprising two silicon atoms linked by an aliphatic polycyclic moiety.

In some embodiments, the at least one compound having a methine (HCSi3) moiety is selected from the group consisting of

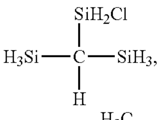, 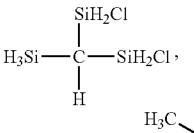, 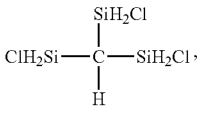,
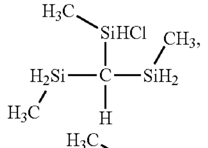, 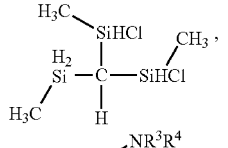,
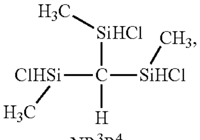, 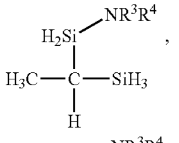,
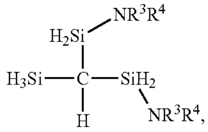, 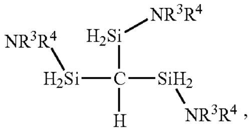, -continued

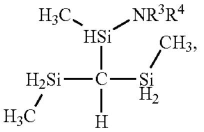 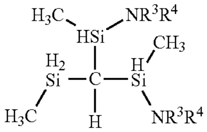 ,

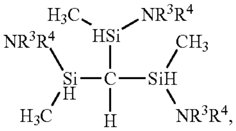 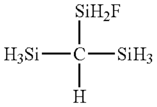 ,

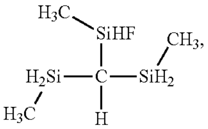 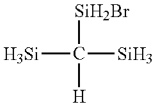 ,

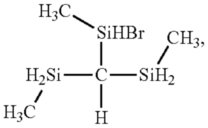 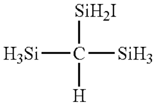 ,

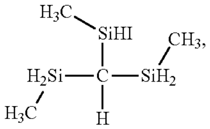 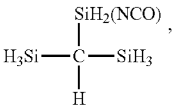 ,

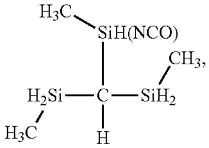 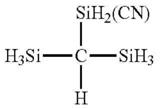 ,

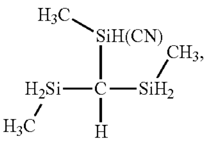 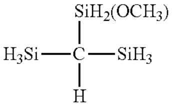 , and

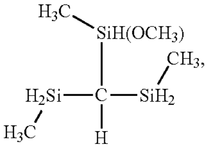

wherein R3 is independently selected from the group consisting of a linear C1 to C10 alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group; and R4 is selected from the group consisting of hydrogen, a C1 to C10 linear alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group, wherein R3 and R4 may be linked to form a cyclic ring structure.

In other embodiments, the at least one compound having a quaternary carbon (Si4C) moiety is selected from the group consisting of

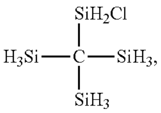 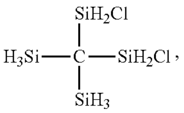 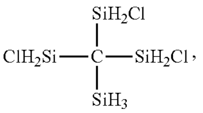

-continued

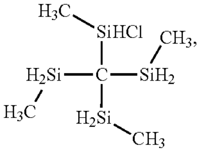 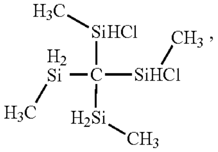

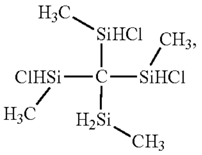 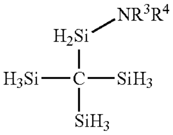 ,

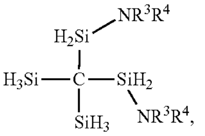 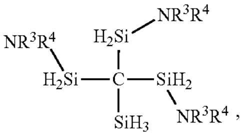

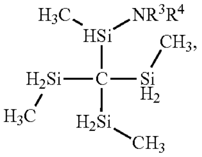 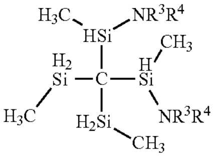 ,

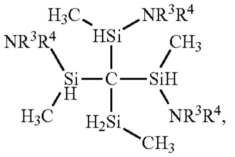 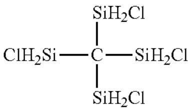 ,

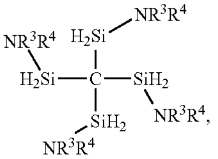 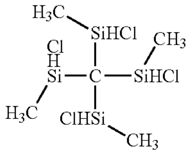 ,

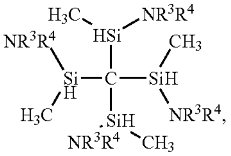 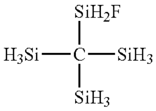 ,

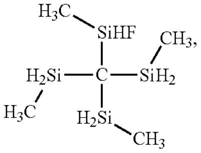 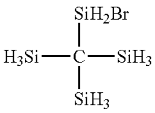 ,

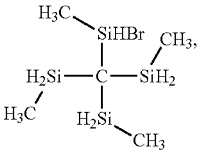 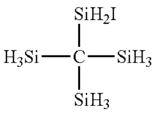 ,

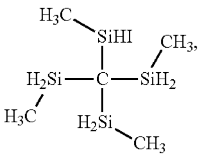 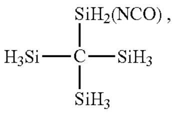

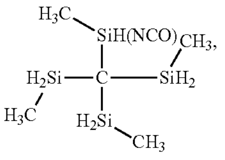 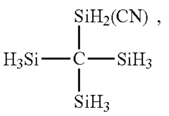

-continued

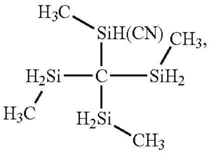 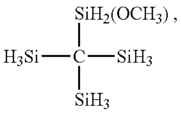,

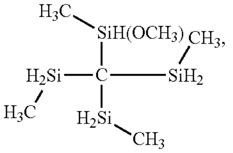

wherein $R^3$ is independently selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^4$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^3$ and $R^4$ may be linked to form a cyclic ring structure.

In still other embodiments, the at least one compound having a moiety comprising two silicon atoms linked by a phenylene group is selected from the group consisting of

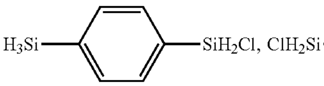, 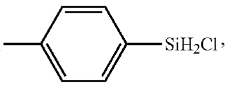,

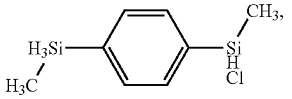

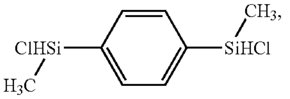

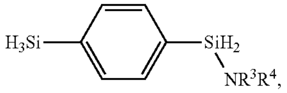

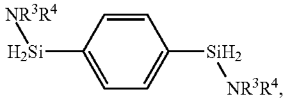

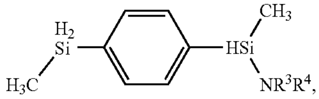

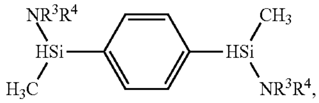

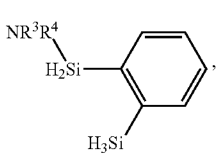, 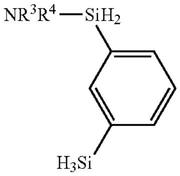,

-continued

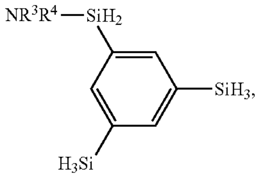 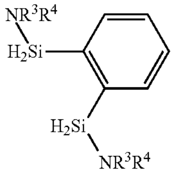,

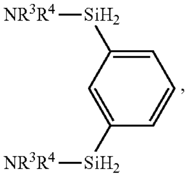, 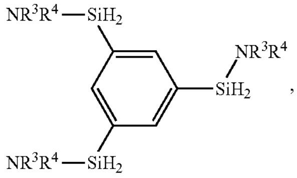,

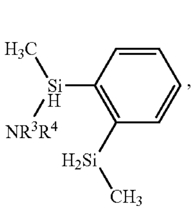, 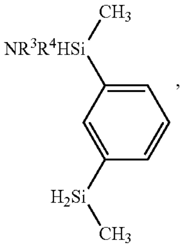,

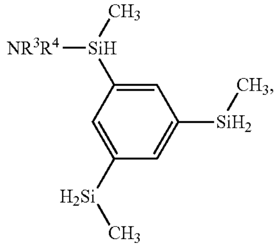 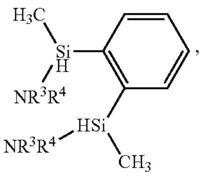,

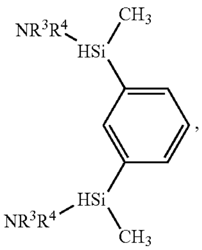, 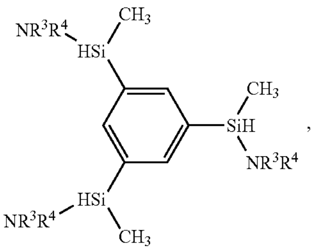,

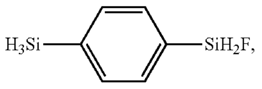 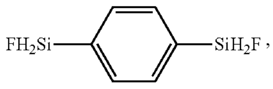,

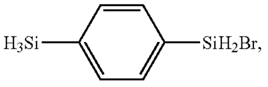 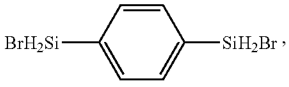,

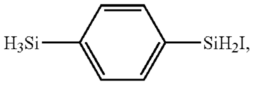 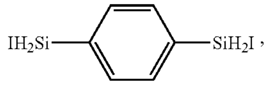,

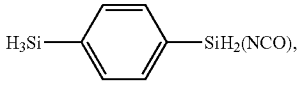,

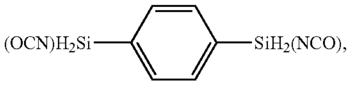

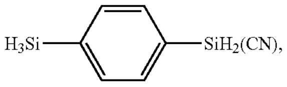

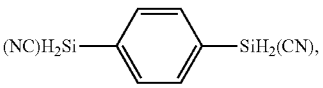

-continued

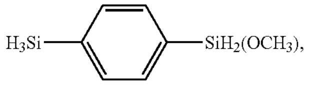

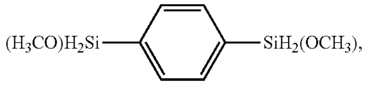

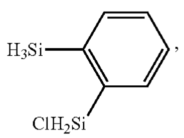

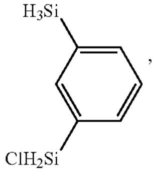

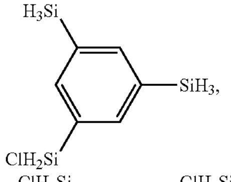

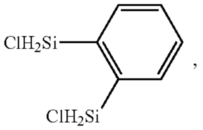

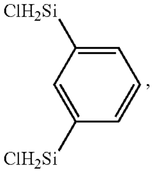

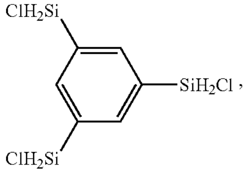

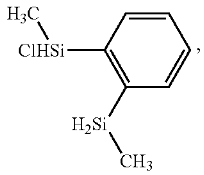

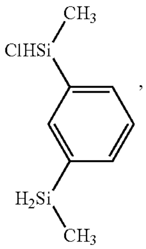

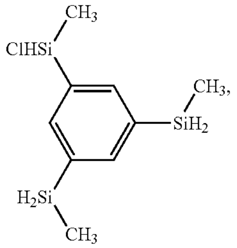

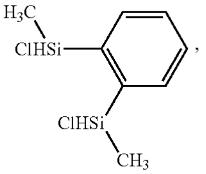

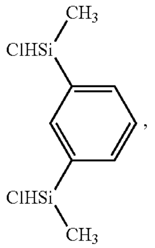

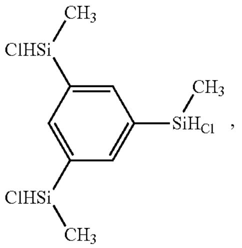

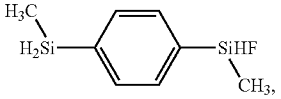

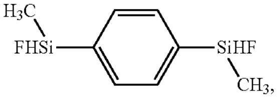

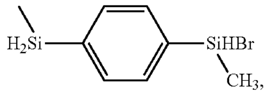

-continued

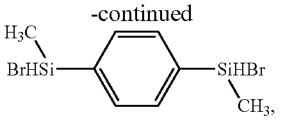

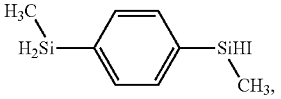

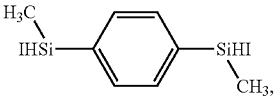

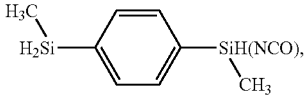

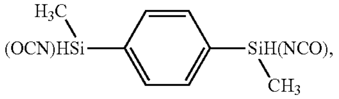

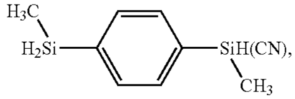

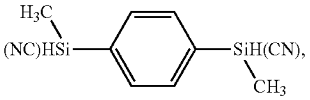

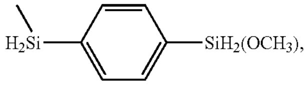

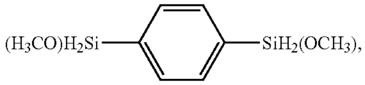

wherein $R^3$ is independently selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^4$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^3$ and $R^4$ may be linked to form a cyclic ring structure.

In yet other embodiments, the at least one compound having a moiety comprising two silicon atoms linked by an aliphatic polycyclic moiety is selected from the group consisting of

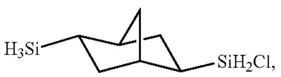

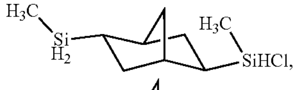

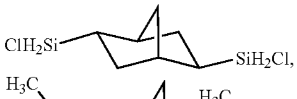

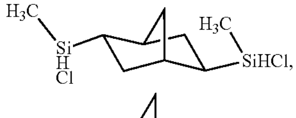

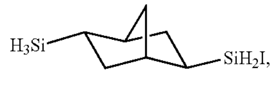

-continued

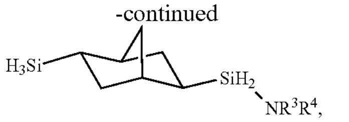

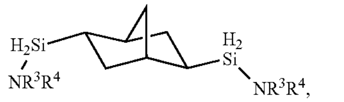

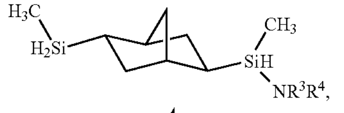

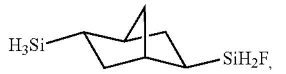

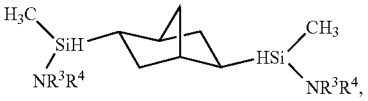

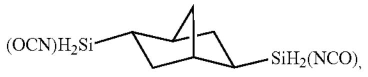

wherein $R^3$ is independently selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^4$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^3$ and $R^4$ may be linked to form a cyclic ring structure.

The at least one organosilicon compound is selected from the group consisting of i. at least one compound having a methine (HCSi3) moiety, ii. at least one compound having a quaternary carbon (Si4C) moiety, iii. at least one compound having a moiety comprising two silicon atoms linked by a phenylene group, and iv. at least one compound having a moiety comprising two silicon atoms linked by an aliphatic polycyclic moiety is/are also referred to herein as "silicon precursor(s)" or "silicon precursor compounds" or, "the compounds disclosed herein."

Without wishing to be bound by any theory or explanation, it is believed that the effectiveness of the precursor compositions disclosed herein can vary as a function of the number of silicon atoms and, in particular, the silicon atom bonds. The use of an organic linking group between two silicon atoms can similarly improve plasma and oxidation resistance by making that linking group oxidation resistant. Examples of oxidation resistant bridging linkers include 1,4-phenylenegroup (or other positional isomers of phenylene, or possibly trisubstituted phenylenes) and aliphatic polycyclic linkers such as norbonanediyl.

To be effective in an ALD deposition process, the precursors disclosed herein are characterized in that at least one of the silicon atoms must have at least one labile ligand. Examples of labile ligands include compounds more labile that hydride and include: halide (chloride, bromide, iodide or fluoride); pseudohalide (e.g., isocyanato, isothiocycanato, cyano); organoamino (for example secondary organic amino ligands such as: dimethylamino, diethylamino, ethylmethylamino, diisopropylamino, di-n-propylamino, di-s-butylamino, di-i-butylamino, di-t-butylamino, phenylmethylamino, 2,6-dimethylpiperidinyl and the like. Primary organoamino ligands such as ethylamino, n-propylamino, i-propylamino, n-butylamino, s-butylamino, t-butylamino, phenylamino (anilino) and the like); alkoxo (for examples like methoxy, ethoxyl, hydroxyl, i-propoxy, n-propoxy, s-butoxy, t-butoxy, i-butoxy, n-butoxy).

The precursors disclosed herein have different structures that heretofore were not known in the art and, therefore, are able to perform better than conventional silicon-containing precursors and provide relatively high GPC, yielding a higher quality film, having a favorable wet etch rate, having a favorable oxygen ash resistance, or having less elemental contaminations.

In one embodiment, the composition disclosed herein comprises at least one compound having a methine (HCSi3) moiety. In another embodiment, the composition disclosed herein comprises at least one compound having a quaternary carbon (Si4C) moiety. In another embodiment, the composition disclosed herein comprises at least one compound having a moiety comprising two silicon atoms linked by a phenylene group. In yet another embodiment, the composition disclosed herein comprises at least one compound having a moiety comprising two silicon atoms linked by an aliphatic polycyclic moiety.

In one embodiment, the composition disclosed herein comprises at least one compound having a methine (HCSi3) moiety and each of R3-4 is independently selected from hydrogen and a C1 to C4 alkyl group. In another embodiment, the composition disclosed herein comprises at least one compound having a quaternary carbon (Si4C) moiety and each of R3-4 is independently selected from hydrogen and a C1 to C4 alkyl group. In yet another embodiment, the composition disclosed herein comprises at least one compound having a moiety comprising two silicon atoms linked by a phenylene group and each of R3-4 is independently selected from hydrogen and a C1 to C4 alkyl group. In still another embodiment, the composition disclosed herein comprises at least one compound having a moiety comprising two silicon atoms linked by an aliphatic polycyclic moiety and each of R3-4 is independently selected from hydrogen and a C1 to C4 alkyl group.

In the formulae above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In the formulae above and throughout the description, the term "alkenyl group" denotes a group which has one or more carbon-carbon double bonds and has from 2 to 10 or from 2 to 6 carbon atoms.

In the formulae described herein and throughout the description, the term "dialkylamino" group, "alkylamino" group, or "organoamino" group denotes a group which has two alkyl groups bonded to a nitrogen atom or one alkyl bonded to a nitrogen atom and has from 1 to 10 or from 2 to 6 or from 2 to 4 carbon atoms. Examples include but not limited to HNMe, HNBut, NMe2, NMeEt, NEt2, and NPri2.

In the formulae above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl.

Throughout the description, the term "alkyl hydrocarbon" refers a linear or branched C1 to C20 hydrocarbon, cyclic C6 to C20 hydrocarbon. Exemplary hydrocarbons include, but not limited to, heptane, octane, nonane, decane, dodecane, cyclooctane, cyclononane, and cyclodecane.

Throughout the description, the term "alkoxy" refers a C1 to C10-OR group, wherein R is an alkyl group as defined above. Exemplary alkoxy groups include, but are not limited to, methoxy, ethoxy, iso-propoxy, n-propoxy, n-butoxy, sec-butoxy, tert-butoxy, and phenoxide.

Throughout the description, the term "aromatic hydrocarbon" refers a C6 to C20 aromatic hydrocarbon. Exemplary aromatic hydrocarbon n includes, but not limited to, toluene, and mesitylene.

In the formulae above and throughout the description, the term "heterocyclic" means a non-aromatic saturated monocyclic or multicyclic ring system of about 3 to about 10 ring atoms, preferably about 5 to about 10 ring atoms, in which one or more of the atoms in the ring system is/are element(s) other than carbon, for example nitrogen, oxygen or sulfur. Preferred heterocycles contain about 5 to about 6 ring atoms. The prefix aza, oxo or thio before heterocycle means that at least a nitrogen, oxygen or sulfur atom respectively is present as a ring atom. The heterocyclic group is optionally substituted.

Preferably, the silicon precursor compounds disclosed herein and compositions comprising the silicon precursor compounds disclosed herein are substantially free of halide ions. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight) measured by ion chromatography (IC) or inductively coupled plasma mass spectrometry (ICP-MS), preferably less than 3 ppm measured by IC or ICP-MS, and more preferably less than 1 ppm measured by IC or ICP-MS, and most preferably 0 ppm measured by IC or ICP-MS. Chlorides are known to act as decomposition catalysts for certain silicon precursor compounds. Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts. The silicon precursor compounds disclosed herein are preferably substantially free of metal ions such as, Li+, Na+, K+, Mg2+, Ca2+, Al3+, Fe2+, Fe2+, Fe3+, Ni2+, Cr3+. As used herein, the term "substantially free" as it relates to Li, Na, K, Mg, Ca, Al, Fe, Ni, Cr means less than 5 ppm (by weight), preferably less than 3 ppm, and more preferably less than 1 ppm, and most preferably 0.1 ppm as measured by ICP-MS. In some embodiments, the silicon precursor compounds disclosed herein are free of metal ions such as, Li+, Na+, K+, Mg2+, Ca2+, Al3+, Fe2+, Fe2+, Fe3+, Ni2+, Cr3+. As used herein, the term "free of" metal impurities as it relates to Li, Na, K, Mg, Ca, Al, Fe, Ni, Cr, noble metal such as volatile Ru or Pt complexes from ruthenium or platinum catalysts used in the synthesis, means less than 1 ppm, preferably 0.1 ppm (by weight) as measured by ICP-MS or other analytical method for measuring metals. In addition, the silicon compounds having Formula I are preferably to have purity of 98 wt. % or higher, more preferably 99 wt. % or higher as measured by GC when use as precursor to deposit silicon-containing films.

In another embodiment, there is provided a method for depositing a film comprising silicon and oxygen onto a substrate, the method comprising the steps of:

a. providing a substrate in a reactor;
b. introducing into the reactor a composition comprising at least one organosilicon compound having two or more silicon atoms connected to a carbon atom, wherein the at least one organosilicon compound is selected from the group consisting of
i. at least one compound having a methine ($HCSi_3$) moiety,
ii. at least one compound having a quaternary carbon ($Si_4C$) moiety,
iii. at least one compound having a moiety comprising two silicon atoms linked by a phenylene group, and
iv. at least one compound having a moiety comprising two silicon atoms linked by an aliphatic polycyclic moiety;
c. purging the reactor with a purge gas;
d. introducing at least one of an oxygen-containing source and/or a nitrogen-containing source into the reactor; and
e. purging the reactor with the purge gas, wherein the steps b through e are repeated until a desired thickness of film is deposited; and wherein the method is conducted at one or more temperatures ranging from about 25° C. to 600° C.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases, for example, may be performed by varying the duration of the time for supplying them to change the stoichiometric composition of the resulting dielectric film. Also, purge times after precursor or oxidant steps can be minimized to <0.1 s so that throughput is improved. In some particular embodiments of this invention, the film comprising silicon and oxygen using one organosilicon compound selected from the group consisting of iii and iv and mild oxidant such as low concentration of ozone (i.e. ozone concentration from 1 wt to 15 wt %) may be a porous low k film if some of the phenylene groups or aliphatic polycyclic moiety stay in the final film.

The methods disclosed herein form a silicon oxide film comprising at least one of the following characteristics a density of at least about 2.1 g/cc; a wet etch rate that is less than about 2.5 Å/s as measured in a solution of 1:100 of HF to water dilute HF (0.5 wt. % dHF) acid; an electrical leakage of less than about 1 e-8 A/cm2 up to 6 MV/cm; and a hydrogen impurity of less than about 5 e20 at/cc as measured by Secondary Ion Mass Spectrometry (SIMS).

In certain embodiments of the methods and compositions described herein, a layer of silicon oxide-containing dielectric material, for example, is deposited on at a least a portion of a substrate via a chemical vapor deposition (CVD) process employing a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("SiO2"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, SiO2, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen (N2), helium (He), neon, hydrogen (H2), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

Throughout the description, the term "ALD or ALD-like" refers to a process including, but not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor.

The method of the present invention is conducted via an ALD process that uses ozone or an oxygen-containing source which comprises a plasma wherein the plasma can further comprise an inert gas such as one or more of the following: an oxygen plasma with or without inert gas, a water vapor plasma with or without inert gas, a nitrogen oxide (e.g., N2O, NO, NO2) plasma with or without inert gas, a carbon oxide (e.g., CO2, CO) plasma with or without inert gas, and combinations thereof.

The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

In certain embodiments, the compounds/compositions described herein—and which are employed in the disclosed methods—further comprises a solvent. Exemplary solvents can include, without limitation, ether, tertiary amine, alkyl hydrocarbon, aromatic hydrocarbon, tertiary aminoether, and combinations thereof. In certain embodiments, the difference between the boiling point of the silicon precursor and the boiling point of the solvent is 40° C. or less. In some embodiments, the compositions can be delivered via direct liquid injection into a reactor chamber for silicon-containing film.

For those embodiments wherein at least one of the compounds disclosed herein is/are used in a composition comprising a solvent, the solvent or mixture thereof selected does not react with the silicon precursor. The amount of solvent by weight percentage in the composition ranges from 0.5 wt % by weight to 99.5 wt % or from 10 wt % by weight to 75 wt %. In this or other embodiments, the solvent has a boiling point (b.p.) similar to the b.p. of the silicon precursor or the difference between the b.p. of the solvent and the b.p. of the silicon precursor is 40° C. or less, 30° C. or less, or 200 C or less, or 100 C. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In certain embodiments, silicon oxide or carbon doped silicon oxide films deposited using the methods described herein are formed in the presence of oxygen-containing source comprising ozone, water (H2O) (e.g., deionized water, purifier water, and/or distilled water), oxygen (O2), oxygen plasma, NO, N2O, NO2, carbon monoxide (CO), hydrogen peroxide, carbon dioxide (CO2) and combinations thereof. The oxygen-containing source is passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma. In certain embodiments, the oxygen-containing plasma source comprises an oxygen source gas that is introduced into the reactor at a flow rate ranging from about 1 to about 2000 standard cubic centimeters (sccm) or from about 1 to about 1000 sccm. The oxygen-containing plasma source can be introduced for a time that ranges from about 0.1 to about 100 seconds. In one particular embodiment, the oxygen-containing plasma source comprises water having a temperature of 10° C. or greater. In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds) depending on the ALD reactor's volume, and the oxygen-containing plasma source can have a pulse duration that is less than 0.01 seconds (e.g., about 0.001 to about 0.01 seconds).

In one or more embodiments described above, the oxygen-containing plasma source is selected from the group consisting of oxygen plasma with or without inert gas water vapor plasma with or without inert gas, nitrogen oxides (N2O, NO, NO2) plasma with or without inert gas, carbon oxides (CO2, CO) plasma with or without inert gas, and combinations thereof. In certain embodiments, the oxygen-containing plasma source further comprises an inert gas. In these embodiments, the inert gas is selected from the group consisting of argon, helium, nitrogen, hydrogen, or combinations thereof. In an alternative embodiment, the oxygen-containing plasma source does not comprise an inert gas.

The respective step of supplying the precursors, oxygen source, and/or other precursors, source gases, and/or reagents may be performed by changing the time for supplying them to change the stoichiometric composition of the resulting dielectric film.

Energy is applied to the at least one of the silicon precursors disclosed herein, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one silicon precursor may be delivered to the reaction chamber such as a plasma enhanced cyclic CVD or PEALD reactor or a batch furnace type reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

As previously mentioned, the purity level of the at least one silicon precursor is sufficiently high enough to be acceptable for reliable semiconductor manufacturing. In certain embodiments, the at least one silicon precursor described herein comprise less than 2% by weight, or less than 1% by weight, or less than 0.5% by weight of one or more of the following impurities: free amines, free halides or halogen ions, and higher molecular weight species. Higher purity levels of the silicon precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the at least one silicon precursor and an oxygen plasma source. The PEALD-like process is defined as a plasma enhanced cyclic CVD process but still provides high conformal silicon and oxygen-containing films.

In one particular embodiment, the method described herein deposits a high quality silicon and oxygen containing film on a substrate. The method comprises the following steps:

a. providing a substrate in a reactor;
b. introducing into the reactor a composition comprising at least one organosilicon compound having two or more r silicon atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, iii. at least one compound having a moiety comprising two silicon atoms linked by a phenylene group as defined herein, and iv. at least one compound having a moiety comprising two silicon atoms linked by an aliphatic polycyclic moiety;
c. purging the reactor with purge gas to remove at least a portion of the unabsorbed precursors;
d. introducing an oxygen-containing plasma source into the reactor; and
e. purging the reactor with purge gas to remove at least a portion of the unreacted oxygen source, wherein steps b through e are repeated until a desired thickness of the silicon-containing film is deposited.

In another particular embodiment, the method described herein deposits a high quality silicon and oxygen containing film on a substrate at temperatures greater than 600° C. The method comprises the following steps:

a. providing a substrate in a reactor;
b. introducing into the reactor a composition comprising at least one organosilicon compound having two or more silicon atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, iii. at least one compound having a moiety comprising two silicon atoms linked by a phenylene group, and iv. at least one compound having a moiety comprising two silicon atoms linked by an aliphatic polycyclic moiety;
c. purging the reactor with purge gas to remove at least a portion of the unabsorbed precursors;
d. introducing an oxygen-containing plasma source into the reactor; and
e. purging the reactor with purge gas to remove at least a portion of the unreacted oxygen source, wherein steps b through e are repeated until a desired thickness of the silicon-containing film is deposited.

Another method disclosed herein forms a carbon doped silicon oxide film using a composition comprising at least one organosilicon compound having two or more silicon atoms connected to a carbon atom, wherein the at least one organosilicon compound is selected from the group consisting of i. at least one compound having a methine (HCSi3) moiety, ii. at least one compound having a quaternary carbon (Si4C) moiety, iii. at least one compound having a moiety comprising two silicon atoms linked by a phenylene group as defined herein, and iv. at least one compound having a moiety comprising two silicon atoms linked by an aliphatic polycyclic moiety as defined herein plus an oxygen source.

Another exemplary process is described as follows:

a. providing a substrate in a reactor;
b. contacting vapors generated from a composition comprising at least one organosilicon compound having two or more silicon atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, and iii. at least one compound having a moiety comprising two silicon atoms linked by a phenylene group, and iv. at least one compound having a moiety comprising two silicon atoms linked by an aliphatic polycyclic moiety as defined herein, with or without co-flowing an oxygen source to chemically absorb the precursors on the heated substrate;
c. purging from the reactor any unabsorbed precursors;
d. Introducing an oxygen source on the heated substrate to react with the absorbed precursors; and
e. purging from the reactor any unreacted oxygen source, wherein steps b through e are repeated until a desired thickness is achieved.

In another particular embodiment, the method described herein deposits a high quality silicon carboxynitride film, on a substrate. The method comprises the following steps:

a. providing a substrate in a reactor;
b. introducing into the reactor a composition comprising at least one organosilicon compound having two or more silicon atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, and iii. at least one compound having a moiety comprising two silicon atoms linked by a phenylene group, and iv. at least one compound having a moiety comprising two silicon atoms linked by an aliphatic polycyclic moiety as defined herein;
c. purging the reactor with purge gas to remove at least a portion of the unabsorbed precursors;
d. introducing a nitrogen-containing plasma source into the reactor; and
e. purging the reactor with purge gas to remove at least a portion of the unreacted nitrogen source, wherein steps b through e are repeated until a desired thickness of the silicon carboxynitride. containing film is deposited.

Another exemplary process is described as follows to deposit silicon carbonitride:

a. providing a substrate in a reactor;
b. contacting vapors generated from a composition comprising at least one organosilicon compound having two or more silicon atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, and iii. at least one compound having a moiety comprising two silicon atoms linked by a phenylene group, and iv. at least one compound having a moiety comprising two silicon atoms linked by an aliphatic polycyclic moiety as defined herein, with or without co-flowing a nitrogen source to chemically absorb the precursors on the heated substrate;
c. purging away from the reactor any unabsorbed precursors;
d. introducing a nitrogen source on the heated substrate to react with the absorbed precursors; and,
e. purging away from the reactor any unreacted nitrogen source, wherein steps b through e are repeated until a desired thickness is achieved.

In another particular embodiment, the method described herein deposits a high quality silicon carboxynitride film, on a substrate. The method comprises the following steps:

a. providing a substrate in a reactor;
b. introducing into the reactor a composition comprising at least one organosilicon compound having two or more atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, and iii. at least one compound having a moiety comprising two silicon atoms linked by a phenylene group, and iv. at least one compound having a moiety comprising two silicon atoms linked by an aliphatic polycyclic moiety as defined herein;
c. purging the reactor with purge gas to remove at least a portion of the unabsorbed precursors;
d. introducing a nitrogen-containing plasma source into the reactor;
e. purging the reactor with purge gas to remove at least a portion of the unreacted nitrogen source;
f. repeating steps b through e until a desired thickness of the silicon carboxynitride;
g. treating the resulting carbon doped silicon nitride film with an oxygen source at one or more temperatures ranging from about ambient temperature to 1000° C. or from about 100° to 400° C. to convert the silicon carboxynitride film into a carbon doped silicon oxynitride film; and optionally, providing post-deposition exposing the carbon doped silicon oxide film to a plasma comprising hydrogen.

In another particular embodiment, the method described herein deposits a high quality silicon carboxynitride film, on a substrate. The method comprises the following steps:

a. providing a substrate in a reactor;
b. introducing into the reactor a composition comprising at least one organosilicon compound having two or more silicon atoms connected to a carbon atom, wherein the at least one organosilicon compound is selected from the group consisting of i. at least one compound having a methine ($HCSi_3$) moiety, ii. at least one compound having a quaternary carbon ($Si_4C$) moiety, and iii. at least one compound having a moiety comprising two silicon atoms linked by a phenylene group, and iv. at least one compound having a moiety comprising two silicon atoms linked by an aliphatic polycyclic moiety as defined herein;
c. purging the reactor with purge gas to remove at least a portion of the unabsorbed precursors;

d. introducing a nitrogen-containing source into the reactor;

e. purging the reactor with purge gas to remove at least a portion of the unreacted nitrogen source;

f. repeating steps b through e until a desired thickness of the silicon carboxynitride;

g. treating the resulting carbon doped silicon nitride film with an oxygen source at one or more temperatures ranging from about ambient temperature to 1000° C. or from about 100° to 400° C. to convert the silicon carboxynitride film into a carbon doped silicon oxynitride film; and h. optionally, providing post-deposition exposing the carbon doped silicon oxide film to a plasma comprising hydrogen.

Various commercial ALD reactors such as single wafer, semi-batch, batch furnace or roll to roll reactor can be employed for depositing the solid silicon oxide, silicon oxynitride, carbon doped silicon oxynitride, or carbon doped silicon oxide.

Process temperature for the method described herein use one or more of the following temperatures as endpoints: 0° C., 25° C., 50° C., 75° C., 100° C., 125° C., 150° C., 175° C., 200° C., 225° C., 250° C., 275° C., 300° C., 325° C., 350° C., 375° C., 400° C., 425° C., 450° C., 500° C., 525° C., 550° C., 600° C., 650° C., 700° C., 750° C., 760° C., and 800° C. Exemplary temperature ranges include, but are not limited to the following: from about 0° C. to about 300° C.; or from about 25° C. to about 300° C.; or from about 50° C. to about 290° C.; or from about 25° C. to about 250° C., or from about 25° C. to about 200° C.

In a still further embodiment of the method described herein, the film or the as-deposited film deposited from an ALD or ALD-like process is subjected to a treatment step (post deposition). The treatment step can be conducted during at least a portion of the deposition step, after the deposition step, and combinations thereof. Exemplary treatment steps include, without limitation, treatment via high temperature thermal annealing, plasma treatment, ultraviolet (UV) light treatment, laser, electron beam treatment, and combinations thereof to affect one or more properties of the film.

In another embodiment, a vessel or container for depositing a silicon-containing film comprising one or more silicon precursor compounds described herein. In one particular embodiment, the vessel comprises at least one pressurizable vessel (preferably of stainless steel having a design such as disclosed in U.S. Pat. Nos. 7,334,595; 6,077,356; 5,069,244; and 5,465,766 the disclosure of which is hereby incorporated by reference. The container can comprise either glass (borosilicate or quartz glass) or type 316, 316 L, 304 or 304 L stainless steel alloys (UNS designation S31600, S31603, S30400 S30403) fitted with the proper valves and fittings to allow the delivery of one or more precursors to the reactor for an ALD process. In this or other embodiments, the silicon precursor is provided in a pressurizable vessel comprised of stainless steel and the purity of the precursor is 98% by weight or greater or 99.5% or greater which is suitable for the majority of semiconductor applications. The head-space of the vessel or container is filled with inert gases selected from helium, argon, nitrogen and combination thereof.

A flow of argon and/or other gas may be employed as a carrier gas to help deliver the vapor of the at least one silicon precursor to the reaction chamber during the precursor pulsing. In certain embodiments, the reaction chamber process pressure is about 50 mTorr to 10 Torr. In other embodiments, the reaction chamber process pressure can be up to 760 Torr (e.g., about 50 mtorr to about 100 Torr).

In a typical PEALD or a PEALD-like process such as a PECCVD process, the substrate such as a silicon oxide substrate is heated on a heater stage in a reaction chamber that is exposed to the silicon precursor initially to allow the complex to chemically adsorb onto the surface of the substrate.

The films deposited with a composition comprising at least one organosilicon compound having two or more silicon atoms connected to a carbon atom, wherein the at least one organosilicon compound is selected from the group consisting of i. at least one compound having a methine (HCSi3) moiety, ii. at least one compound having a quaternary carbon (Si4C) moiety, and iii. at least one compound having a moiety comprising two silicon atoms linked by a phenylene group as defined herein, and iv. at least one compound having a moiety comprising two silicon atoms linked by an aliphatic polycyclic moiety, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD cycles, such as, without limitation, one (1) ALD cycle, two (2) ALD cycles, five (5) ALD cycles, or after every ten (10) or more ALD cycles.

The silicon precursors disclosed herein preferably exhibit a growth rate of 1.5 Å/cycle or greater.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as H2O, N2O, NO2 or O2).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as SiO2 or carbon-doped SiO2 is deposited to prevent chlorine and nitrogen contamination to penetrate into film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

In certain embodiments, the silicon precursors disclosed herein and as defined above can also be used as a dopant for metal containing films, such as but not limited to, metal oxide films or metal oxynitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands.

Examples of suitable metal amide precursors that may be used with the method disclosed herein include, but are not limited to, tetrakis(dimethylamino)zirconium (TDMAZ), tetrakis(diethylamino)zirconium (TDEAZ), tetrakis(ethylmethylamino)zirconium (TEMAZ), tetrakis(dimethylamino) hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino) tantalum (TBTDMT), tert-butylimino tri (ethylmethylamino)tantalum (TBTEMT), ethylimino tri (diethylamino)tantalum (EITDET), ethylimino tri (dimethylamino)tantalum (EITDMT), ethylimino tri (ethylmethylamino)tantalum (EITEMT), tert-amylimino tri (dimethylamino)tantalum (TAIMAT), tert-amylimino tri (diethylamino)tantalum, pentakis(dimethylamino)tantalum, tert-amylimino tri(ethylmethylamino)tantalum, bis(tert-butylimino)bis(dimethylamino)tungsten (BTBMW), bis (tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metals herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

In certain embodiments, the silicon-containing films described herein have a dielectric constant of 4 or less, and 3 or less. In these or other embodiments, the films can a dielectric constant of about 4 or below, or about 3.5 or below. However, it is envisioned that films having other dielectric constants (e.g., higher or lower) can be formed depending upon the desired end-use of the film. An example of a silicon-containing film that is formed using the silicon precursors disclosed herein and the methods described herein has the formulation SixOyCzNvHw wherein Si ranges from about at. 10% to about at. 40%; 0 ranges from about 0% to about 65%; C ranges from about 0% to about at. 75% or from about 0% to about at. 50%; N ranges from about 0% to about at. 75% or from about 0% to at. 50%; and H ranges from about 0% to about 50% atomic percent weight % wherein x+y+z+v+w=100 atomic weight percent, as determined for example, by XPS or other means. Another example of the silicon containing film that is formed using the silicon precursors disclosed herein and the methods disclosed herein is silicon carbo-oxynitride wherein the carbon content is from 1 at. % to 80 at. % measured by XPS. In yet, another example of the silicon containing film that is formed using the silicon precursors the silicon precursors disclosed herein and the methods disclosed herein is amorphous silicon wherein both sum of nitrogen and carbon contents is <10 at. %, preferably <5 at. %, most preferably <1 at. % measured by XPS.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

The methods described herein provide a high quality silicon oxide, silicon oxynitride, carbon doped silicon oxynitride, or carbon-doped silicon oxide film. The term "high quality" means a film that exhibits one or more of the following characteristics: a density of about 2.1 g/cc or greater, 2.2 g/cc or greater, 2.25 g/cc or greater; a wet etch rate that is 2.5 Å/s or less, 2.0 Å/s or less, 1.5 Å/s or less, 1.0 Å/s or less, 0.5 Å/s or less, 0.1 Å/s or less, 0.05 Å/s or less, 0.01 Å/s or less as measured in a solution of 1:100 of HF to water dilute HF (0.5 wt. % dHF) acid, an electrical leakage of about 1 or less e-8 A/cm2 up to 6 MV/cm); a hydrogen impurity of about 5 e20 at/cc or less as measured by SIMS; and combinations thereof. With regard to the etch rate, a thermally grown silicon oxide film has 0.5 Å/s etch rate in 0.5 wt % HF.

In certain embodiments, one or more silicon precursors disclosed herein can be used to form silicon and oxygen containing films that are solid and are non-porous or are substantially free of pores.

The following Examples are provided to illustrate certain aspects of the invention and shall not limit the scope of the appended claims.

Although the disclosure has been described with reference to certain preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the appended claims.

WORKING EXAMPLES

Example 1 Synthesis of 1,4-bis(methylchlorosilyl)benzene 1,4-dibromobenzene (101.4 g, 0.43 mol) dissolved in THF (70 mL) was slowly added to a mixture of magnesium (21.94 g, 0.9 mol) and methyldichlorosilane (296.8 g, 2.58 mol) in THF (100 mL) at temperature below 20° C. The reaction mixture was stirred overnight at room temperature and filtered to provide a crude liquid product. Fractional distillation afforded 47 g of colorless liquid 1,4-bis(methylchlorosilyl)benzene. GC-MS analysis confirmed the molecular ion peak at m/z=235 (M+).

Example 2 Synthesis of bis(methyldimethylaminosilyl)benzene

Dimethyamine (2M, 400 mL) was slowly added to a mixture of 1,4-Bis(methylchlorosilyl)-benzene (94.1 g, 0.4 mol) and triethylamine (81 g, 0.8 mol) in hexanes. The reaction mixture was stirred overnight at room temperature and filtered to provide a crude product. The solvents were removed from the crude product under reduced pressure. Fractional distillation afforded 41 g of colorless liquid 1,4-bis(methyldimethylaminosilyl)benzene with a purity of 99% by GC analysis. GC-MS analysis confirmed the molecular ion peak at m/z=252 (M+).

Example 3. Si Containing Film Deposition with 1,4-bis(methylchlorosilyl)benzene Silicon-containing film was deposited using thermal atomic layer deposition (ALD) technique using a laboratory scale ALD processing tool using 1,4-bis(methylchlorosilyl) benzene as silicon precursor. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12-inch-long silicon strips with resistivity of 8-12 Ohm-cm. A thermocouple was attached on the sample holder to confirm substrate temperature. Depositions were performed using ozone as oxygen source gas. The deposition process is listed in Table 2.

TABLE 2

Process for Atomic Layer Deposition of Silicon Oxide Films with Ozone as Oxygen Source on the Laboratory Scale ALD Processing Tool.

| Steps | Time (s) | Steps | Notes |
|---|---|---|---|
| 1 | | Insert silicon coupons into reactor | |
| 2 | | Evacuate and heat coupons to 100° C. | |
| 3 | 6 seconds | Flow Si precursor into reactor | Reactor pressure = 0.2 Torr |
| 4 | 4 seconds | Soak process | All gases are stopped; throttle valve close |
| 5 | 6 seconds | Purge reactor with nitrogen | Flow 1.5 slpm $N_2$ |
| 6 | 6 seconds | Evacuate reactor to base pressure | <100 mT |
| 7 | 24 seconds | Flow ozone into reactor | Ozone concentration = 5.6%; Reactor pressure = 5 Torr |
| 8 | 6 seconds | Purge reactor with nitrogen | Flow 1.5 slpm $N_2$ |
| 9 | 6 seconds | Evacuate reactor to base pressure | <100 mT |
| 10 | | Remove silicon coupons from reactor | |

Steps 4 to 9 are repeated until a desired thickness is reached.

Thickness and refractive indices of the films were measured using a FilmTek 3000SE ellipsometer by fitting the reflection data from the film to a pre-set physical model (e.g., the Lorentz Oscillator model). The growth rate per cycle is calculated by dividing the measured thickness of resulting silicon oxide film by the number of total ALD cycles. Compositional analysis was done using X-ray photoelectron spectroscopy (XPS)

In two separate deposition runs, The thicknesses of films deposited were 499 Å and 1465 Å after 250 cycles and 750 cycles, respectively, corresponding to growth per cycle of about 2.0 Å/cycles. Film composition is carbon 30.8 at. %, nitrogen 0.7 at. %, oxygen 40.1 at. %, and silicon 28.5 at. %.

The invention claimed is:

1. A composition comprising at least one organosilicon compound selected from the group consisting of

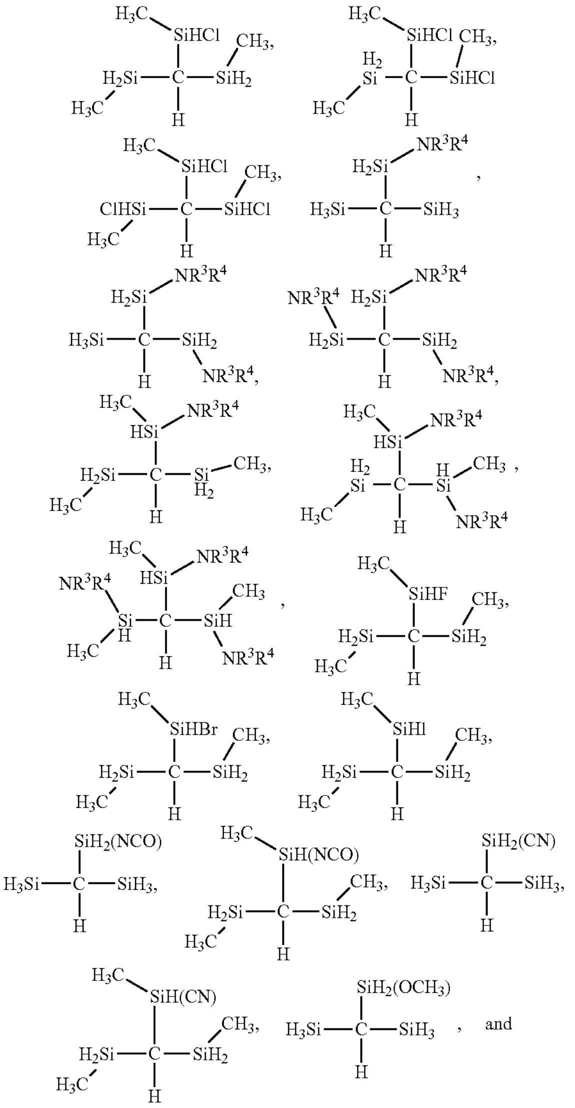

and

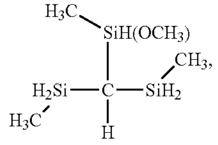

wherein $R^3$ is independently selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^4$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^3$ and $R^4$ may be linked to form a cyclic ring structure.

2. The composition of claim 1 further comprising at least one selected from the group consisting of a solvent and a purge gas.

3. The composition of claim 1 wherein each of $R^{3-4}$ is independently selected from hydrogen and a $C_1$ to $C_4$ alkyl group.

4. The composition of claim 1, wherein the composition has less than 5 ppm of one or more impurities selected from the group consisting of a halide, metal ions, metal, and combinations thereof.

5. A method for depositing a film comprising silicon and oxygen onto a substrate, the method comprising the steps of:

a) providing a substrate in a reactor;

introducing into the reactor a composition comprising at least one organosilicon compound;

c) purging the reactor with purge gas;

d) introducing at least one of an oxygen-containing source and/or a nitrogen-containing source into the reactor; and e) purging the reactor with purge gas, wherein the steps b through e are repeated until a desired thickness of film is deposited; and wherein the method is conducted at one or more temperatures ranging from about 25° C. to 600° C.; and wherein the organosilicon compound is selected from the group consisting of

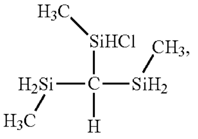
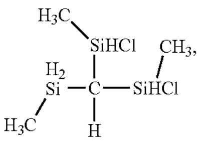
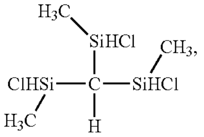
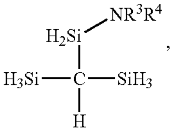
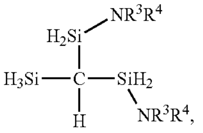
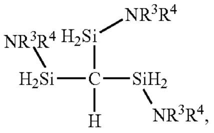
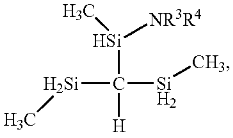
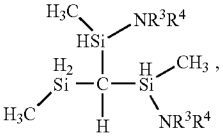

-continued

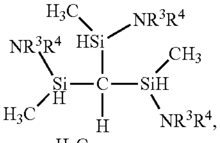
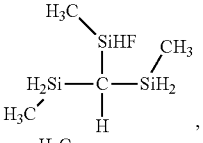
,
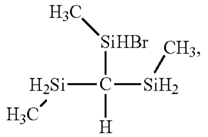
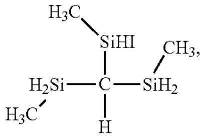
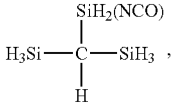
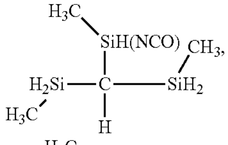
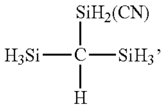
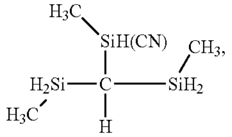
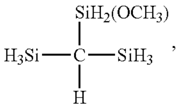
and
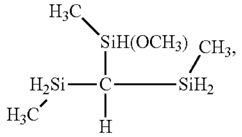

wherein $R^3$ is independently selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; and $R^4$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^3$ and $R^4$ may be linked to form a cyclic ring structure.

6. The method of claim 5 wherein the composition further comprises at least one selected from the group consisting of a solvent and an inert gas.

* * * * *